United States Patent [19]

Collings

[11] Patent Number: 4,750,585

[45] Date of Patent: Jun. 14, 1988

[54] LOUDSPEAKER ENCLOSURE FOR SUPPRESSING UNWANTED AUDIO WAVES

[76] Inventor: Boyd E. Collings, 2149 Kuhio, No. 1605, Honolulu, Hi. 96815

[21] Appl. No.: 57,776

[22] Filed: Jun. 3, 1987

[51] Int. Cl.[4] ............................................ H05K 5/00

[52] U.S. Cl. .................................... 181/148; 181/156; 181/199

[58] Field of Search ............... 181/148, 150, 153, 155, 181/156, 199; 381/88, 90, 153, 160, 156

[56] References Cited

U.S. PATENT DOCUMENTS

| | | | |
|---|---|---|---|
| 1,975,201 | 10/1934 | Elworthy | 181/155 |
| 2,491,982 | 12/1949 | Kincart | 181/156 |
| 2,646,852 | 7/1953 | Forrester | 181/156 |
| 3,263,769 | 8/1966 | Mercurius | 181/155 |
| 4,073,365 | 2/1978 | Johnson | 181/154 X |
| 4,142,604 | 3/1979 | Smith | 181/156 |
| 4,157,741 | 6/1979 | Goldwater | 181/156 X |
| 4,231,446 | 11/1980 | Weiss et al. | 181/148 |
| 4,235,301 | 11/1980 | Mitchell | 181/156 X |
| 4,280,586 | 7/1981 | Petersen | 181/150 |

*Primary Examiner*—B. R. Fuller

*Attorney, Agent, or Firm*—Hughes, Cassidy & Multer

[57] ABSTRACT

A speaker enclosure is configured internally so as to minimize the generation of unwanted audio waves inside the enclosure, as well as to promote dissipation of those waves which are generated inside the enclosure. There is provided at the forward portion of the enclosure an isolation structure which converges in a rearward and inward direction and is located about the speaker diaphragm. There is further provided at a rear portion of the enclosure a structure for deflecting audio waves which are generated rearward from the speaker. The deflection structure reflects the audio waves against the sidewalls of the speaker, with the internal walls of the speaker being nonparallel so as to cause increased reflections of these audio waves and their eventual dissipation.

18 Claims, 4 Drawing Sheets

LOUDSPEAKER ENCLOSURE FOR SUPPRESSING UNWANTED AUDIO WAVES

TECHNICAL FIELD

The present invention relates to an audio loudspeaker enclosure which is configured to suppress and dissipate unwanted audio waves within the enclosure.

BACKGROUND OF THE INVENTION

The purpose of an audio loudspeaker system is the accurate generation of acoustic waveforms. This is accomplished by optimizing the speaker device as well as the associated enclosure.

It is known that when a speaker diaphram moves back and forth, audio waves are generated in both a forward direction from the speaker, and in a rearward direction to locations inside the enclosure. The rearward directed waves are 180° out of phase with the forward directed waves.

In conventional speaker enclosures, the rearward directed waves generate acoustical distortions in several ways. That is, these waves can be reflected internally within the speaker enclosure and in a forward direction where they interfere with the operation of the speaker diaphram.

Acoustical distortion is also produced by the back and forth movement of the speaker diaphram which transmits vibrations through the speaker frame to the enclosure. The resulting resonance of the enclosure walls can generate waves which produce the audio distortion.

A number of conventional loudspeakers have been disclosed. For example, in U.S. Pat. No. 4,157,741 by Goldwater, there is disclosed a speaker system which includes a phase plug which minimizes audio distortion due to phase differences between waves generated by the speaker diaphram by equalizing wave path lengths between various portions of the diaphram and an exponential output horn of the speaker system.

In Mitchell, U.S. Pat. No. 4,235,301, there is disclosed a loudspeaker enclosure which is configured to channel soundwaves emitted from a back surface of a driver speaker so that the soundwaves are shifted in phase and emerge from a port in the speaker enclosure so as to add to the soundwaves emitted from the front surface of the speaker.

Another loudspeaker enclosure which is configured so as to direct rearwardly emitted soundwaves toward the front to combine with, and reinforce the tones emitted from the front of the speaker, is disclosed in U.S. Pat. No. 2,491,982 by Kincart.

Various configurations of speaker enclosures have also been disclosed. For example, in U.S. Pat. No. 4,142,604 by Smith and U.S. Pat. No. 4,280,586 by Petersen, there are disclosed enclosures having pyramidal configurations. Furthermore, in U.S. Pat. No. 4,073,365 by Johnson, there are disclosed speaker enclosures having hexahedronal and tetrahedronal configurations, respectively. Additionally, in U.S. Pat. No. 4,231,446 by Weiss et al, there is disclosed a speaker enclosure having a rhombic dodecahedron configuration.

Other internal configurations of speakers also have been disclosed. In Elworthy, U.S. Pat. No. 1,975,201, there is disclosed a structure located in the interior of a speaker enclosure which includes a number of intersecting walls which combine to produce a plurality of irregularly shaped cells to generate a number of deflected interference soundwaves.

Another loudspeaker enclosure which is divided internally into a number of intercommunicating compartments is disclosed by Forrester in U.S. Pat. No. 2,646,852. Furthermore, a speaker enclosure utilizing two balancing or equalizing chambers for discharging soundwaves into a single conduit for final discharge outwardly from the enclosure is disclosed in U.S. Pat. No. 3,263,769 by Mercurius.

SUMMARY OF THE INVENTION

The present invention relates to a loudspeaker enclosure for suppressing unwanted audio waves. The enclosure includes an audio speaker assembly having an audio generating diaphram with sides that converge in a rearward direction inside the enclosure. In an exemplary embodiment, the audio diaphram has a conical configuration.

The enclosure includes an exterior housing having a front wall, a rear wall, and first and second sidewalls which are connected between the front wall and the rear wall. There is also provided means for connecting the audio speaker assembly to a forward portion of the housing. To promote the suppression of unwanted audio waves, there are provided means for forming a suppression channel of a selected width along the rear surface of the diaphram. The channel forming means includes an isolation member which is connected to the housing and which extends in an inward and rearward direction within the enclosure and about the diaphram sides. The isolation member is positioned at a selected, spaced apart location from the diaphram sides so as to suppress the generation of audio waves of selected frequencies.

In an exemplary embodiment of the present invention, the suppression of selected frequencies of audio waves is a function of a distance between the isolation member and the diaphram.

In a further exemplary embodiment, the enclosure includes means, which are connected to the housing at a rearward location within the housing, for deflecting audio waves which have been generated in a rearward direction inside the housing, toward the first and second sidewalls.

It is an object of the present invention to provide a speaker enclosure for suppressing unwanted waveforms which can degrade the sound qualities of a speaker system.

BRIEF DESCRIPTION OF THE DRAWINGS

This and other objects and advantages of the present invention will become more readily apparent upon reading the following Detailed Description in conjunction with the attached Drawings, in which.

Figure 1:
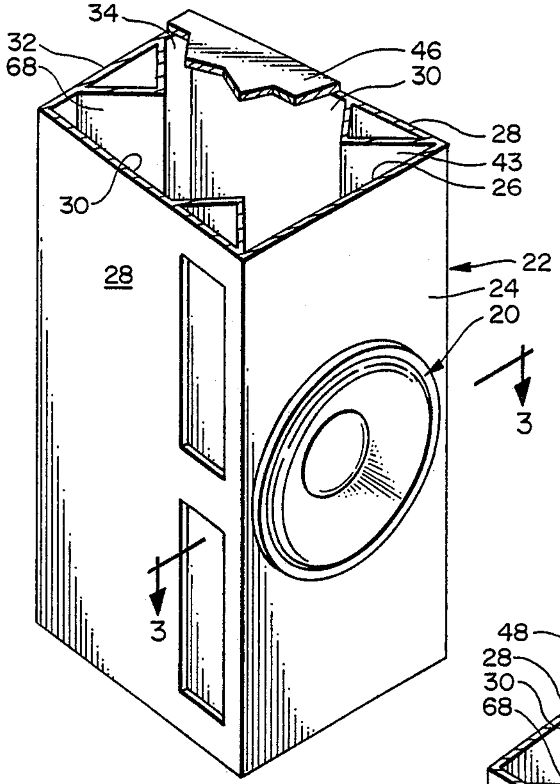
FIG. 1 is a forward isometric view of the speaker system of the present invention.

While the present invention is susceptible to various modifications and alternative forms, specific embodiments thereof have been shown by way of example in the Drawings and will herein be described in detail. It should be understood, however, that it is not intended to limit the invention to the particular forms disclosed, but on the contrary, the intention is to cover all modifications, equivalents and alternatives falling within the spirit and scope of the invention.

DETAILED DESCRIPTION

The present invention pertains to an audio loudspeaker system, and more particularly to a speaker enclosure which is configured so as to (i) minimize the formation of rearward directed audio waves of unwanted frequencies, (ii) dissipate those audio waves which are present in a rear portion of the enclosure, and (iii) prevent those rear audio waves from being reflected in a forward direction toward the speaker.

As discussed previously, during back and forth movement of the speaker diaphram, audio waves are produced on each side of the diaphram that are 180° out of phase with each other. Some of the audio waves which are directed rearwardly within a conventional enclosure are reflected forward toward the speaker and hinder it from faithfully reproducing desired audio waves. The generally accepted method of suppressing these audio waves is to treat the interior of the enclosure with energy absorbing material.

The pressure variations generated by the movement of the speaker diaphram also cause the conventional enclosure panels to vibrate, thereby generating unwanted audio waves in the sound field of the speaker. More particularly, the panels of the loudspeaker enclosure are known to resonate at a fundamental frequency. Audio waves generated by the panel resonance can radiate directly into the sound field in a manner antiphase to those produced at the front of the speaker.

In the present invention, the enclosure is formed so as to dampen a selected range of frequencies present therein. For example, if the enclosure includes a single speaker having an upper frequency range of 1000 Hz, then it is generally desirable to eliminate any frequencies generated within the enclosure which are at or below 1000 Hz. This is accomplished in the present invention by (i) minimizing the formation of rearward directed waves below the selected frequency limit of, say 1000 Hz, and (ii) dissipating those waves which reach the rear portion of the enclosure by reflecting them internally from energy absorbing surfaces mounted on the enclosure walls.

Figure 2:
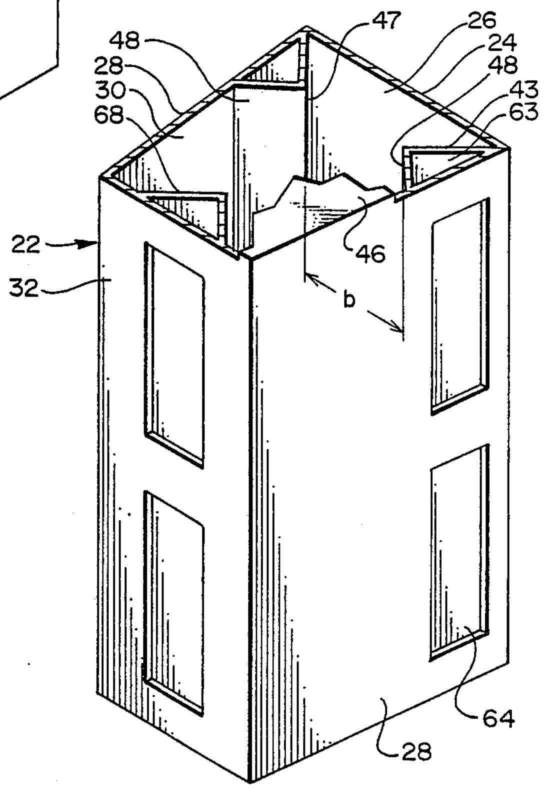
FIG. 2 is a rear isometric view of the speaker system of the present invention.

Referring first to FIGS. 1 and 2, there is shown an audio speaker system including a speaker indicated at 20 which is mounted within an enclosure indicated at 22. The enclosure includes a vertical planar front wall 24 having an inner surface 26, left and right planar sidewalls 28 having inner surfaces 30, and a rear planar endwall 32 having an inner surface 34. In the present invention, the speaker 20 is a conventional speaker including a conical diaphram 36 (FIG. 3), an outer frame 38 and rear magnet 40. The speaker 20 is connected in a conventional manner within an opening in the front wall 24 of the enclosure.

In conventional construction, the loudspeaker uses a coil of fine wire (known as a voice coil) fitted internally within the magnet 40. One end of the voice coil is attached to the diaphram which is suspended from the frame 38 by its outer edge. The voice coil is connected to the output of an audio amplifier (not shown). Signals from the amplifier cause the voice coil, and consequently the diaphram, to vibrate, and thus generate audio waves.

Figure 5:
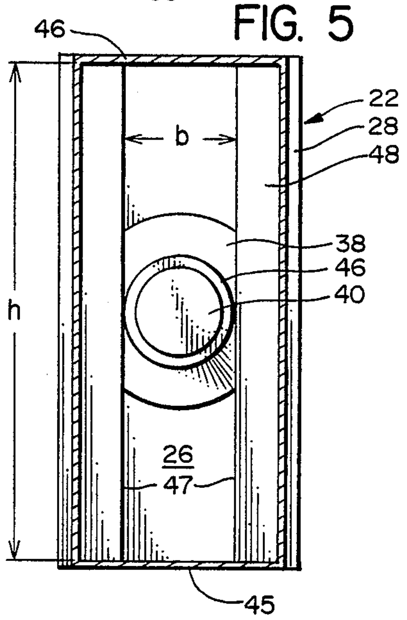
FIG. 5 is a transverse sectional view, looking forward, taken along line 5—5 of FIG. 3.
Figure 6:
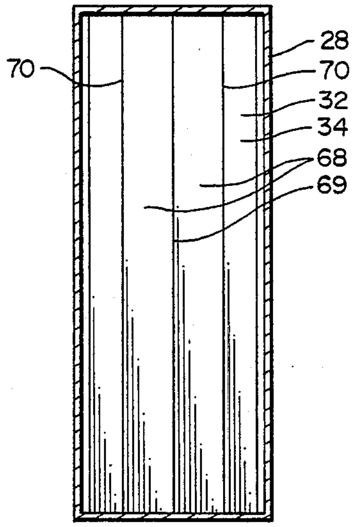
FIG. 6 is a transverse sectional view, looking aft, taken along line 6—6 of FIG. 3.

In a first exemplary embodiment shown in FIGS. 1 through 6, the enclosure 22 is defined by a lengthwise centerline axis designated by the number 41 (FIG. 3), and a transverse axis designated by the number 42. In the present invention, unwanted rearward directed audio waves are suppressed by means of left, right flat isolation panels 43 (FIG. 3) which slant rearward and inward toward centerline 41 from forward corners 44 of the enclosure. The isolation panels 43 (FIG. 4) extend vertically between a floor 45 and ceiling 46 of the enclosure, and terminate at rear vertical edges 47 (FIG. 5). At edges 47 they meet with respective support panels 48 which slant rearward and away from centerline 41 and which join with the inner surfaces 30 of the enclosure sidewalls. To assure audio wave suppression, the rear edges 47 of the isolation sidewalls 43 are located rearward of a rear surface 49 of the diaphram.

In order to suppress unwanted audio waves, it is preferred that the left, right isolation panels 43 be positioned apart from the sides of diaphram 36 to form a channel 50 between the rear surface 51 of the diaphram sidewalls and the inner surface 52 of the isolation panel. More specifically, a distance designated by the letter "a" (FIG. 3) between the rear surface of the diaphram sidewall 36 and the inner surface of the isolation panel 43, should not exceed a determinable maximum quantity which is calculated by the formula $a=c/2f_0$, where "c" equals the speed of sound in air at sea level, and $f_0$ is the minimum frequency limit of audio waves which are to be developed in the channel 50. For example, if it is desired to suppress the generation of those waves which have frequencies that are at or below 1000 Hz, then the maximum distance "a" should equal 1130 (feet per second)/2000=0.6 feet=6.8 inches. Thus, if the highest usable frequency of the speaker is 1000 Hz, and the isolation panel and diaphram are no greater than 6.8 inches apart, it is believed that those audio waves below 1000 Hz will not have sufficient space to properly develop within channel 50.

To avoid formation of the unwanted rearward waveforms in the channel 50, the isolation panels 43 should be mounted so that they are either parallel to the sidewall of the speaker diaphram 36, or more preferably, so that the isolation panels diverge away from the sidewalls of the speaker diaphram as the panels extend rearward and inward within the enclosure.

In the present invention, reduction of unwanted audio waves is also achieved by forming the isolation panels so that a rear outlet area defined by (i) a transverse distance "b" (FIG. 5) between the isolation panel rear edges 47, and (ii) a vertical dimension "h" between the enclosure floor 45 and ceiling 46, is more than the effective area of the speaker diaphram. In the present invention "effective diaphram area", $A_d$, is defined as $A_d=\pi r^2$, where r is a radial distance (FIG. 4) measured in a vertical plane between an axial centerline of the diaphram, designated herein by the number 60, and a circumferential edge 61 of the diaphram. Thus, the rear outlet area, $A_r=b \cdot h$, which provides an outlet for the rearward directed waves, should be larger than the effective area $A_d$ of the speaker diaphragm. This is necessary to ensure there is no unnecessary buildup of pressure between the speaker diaphram and the isolation panels.

To prevent asymmetrical forces on the diaphram, the isolation panels should be positioned symmetrically about the diaphram. That is, if the enclosure were divided along the centerline 41 (FIG. 3), the left isolation panel should be a mirror image of the right isolation panel, with the speaker diaphram positioned at equidistant locations therebetween. If the isolation panels are positioned asymmetrically about the diaphram, it is possible that the resulting pressure distribution between the diaphram and the isolation panels could cause the diaphram to shift laterally in its movement, thereby generating a distorted audio output.

Figure 10:
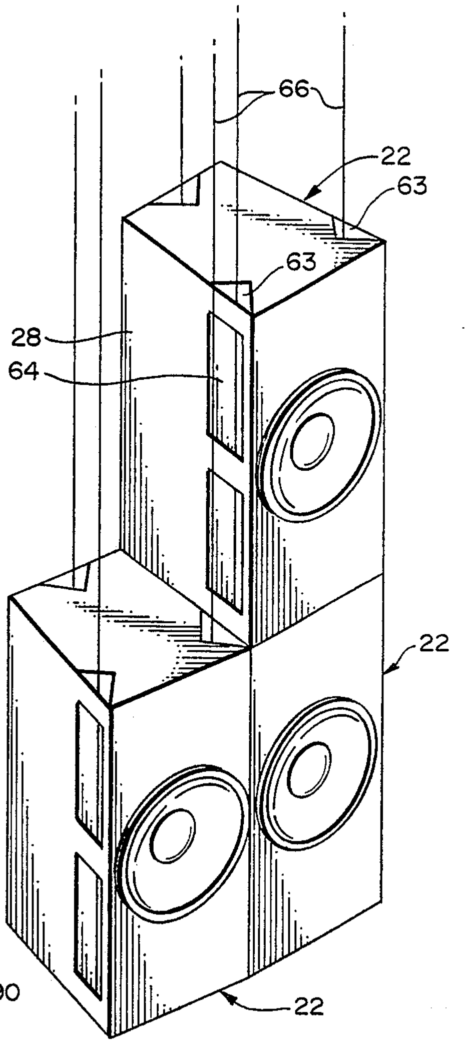
FIG. 10 is a front isometric view showing three of the speaker systems connected together.

In the present invention, a triangular vertical passageway 63 (FIG. 2) is formed by the inner surfaces of sidewall 28, isolation panel 43 and support panel 48. An opening 64 is provided in the sidewall 28 for access to the passageway 63. This permits the speaker enclosures 22 to be suspended by conventional support lines 66 as shown in FIG. 10, and to be nested together such as for use in a large arena or stadium. More particularly, the suspension lines 66 extend downward through the passageway 63 where they are secured to the sidewalls 28 by conventional fasteners such as eyebolts or the like. In the nested configuration, the enclosures are attached by conventional fasteners in a sidewall-to-sidewall and top-to-bottom manner as shown in FIG. 10.

It should be further appreciated that the openings 64 (FIG. 2) provide convenient locations to grasp the enclosure when installing or moving it.

In order to dissipate those waves which are directed rearwardly within the enclosure, the rear wall 32 (FIG. 3) of the enclosure includes a pair of rear deflection panels 68 which slant forward and inward from the inner surface of the rear wall to form a V-shaped member having an apex 69. Deflection panels 68 have flat planar surfaces which extend vertically between the floor and ceiling of the enclosure. The deflection panels are positioned so that the lengthwise centerline 41 bisects the apex 69. This is to ensure that waves reflected rearward from the speaker diaphram between isolation panel edges 47 strike the deflection panels 69. This is further accomplished by forming the deflection panels so that their transverse dimension, indicated by the letter "c", is greater than or equal to the transverse dimension "b" (FIG. 5) of the rear outlet opening. That is, the base of the triangular structure formed by deflection panels 68 is at least as wide as the opening formed between the isolation panel edges 47. In this manner, rearward waves from the diaphram are caused to strike the slanted deflection panels 68 and in turn are reflected toward the sidewalls 28 of the enclosure, instead of being directed forward toward the speaker. In turn, the sidewalls 28, which converge at slight angles in inward and rearward directions, cause further reflections of those waves within the enclosure, which tends to cause their eventual dissipation. This is accomplished by the fact that the inside surfaces of the enclosure, including the converging sidewalls 28, have energy absorbing material, such as Fiberglass batting or open cell foam, attached thereto. Furthermore, the fact that sidewalls 28 are non parallel lessens the opportunity of forming resonant waves which may reflected between the sidewalls.

In a preferred embodiment, the deflection panels 68 from an angle of at least five degrees with the transverse axis 42; and more preferably, panels 68 intersect at right angles at apex 69. In this manner, forward support walls 48 are not parallel to rear deflection panels 68.

A further purpose of the nonparallel converging sidewalls 28 of the enclosure is to minimize reflection of audio waves in a transverse direction between the opposite sidewalls 28. This provides the benefits (i) of minimizing standing waves which are created by waves reflecting back and forth between two parallel surfaces, and (ii) of increasing internal dissipation of the waves by increasing the number of reflections inside the enclosure. Further internal absorption of these waves is caused by the support panels 48. That is, waves which have been reflected in a forward direction toward the speaker are reflected rearward by the support panels which extend inward about the diaphram, thus protecting the diaphram 36.

Figure 3:
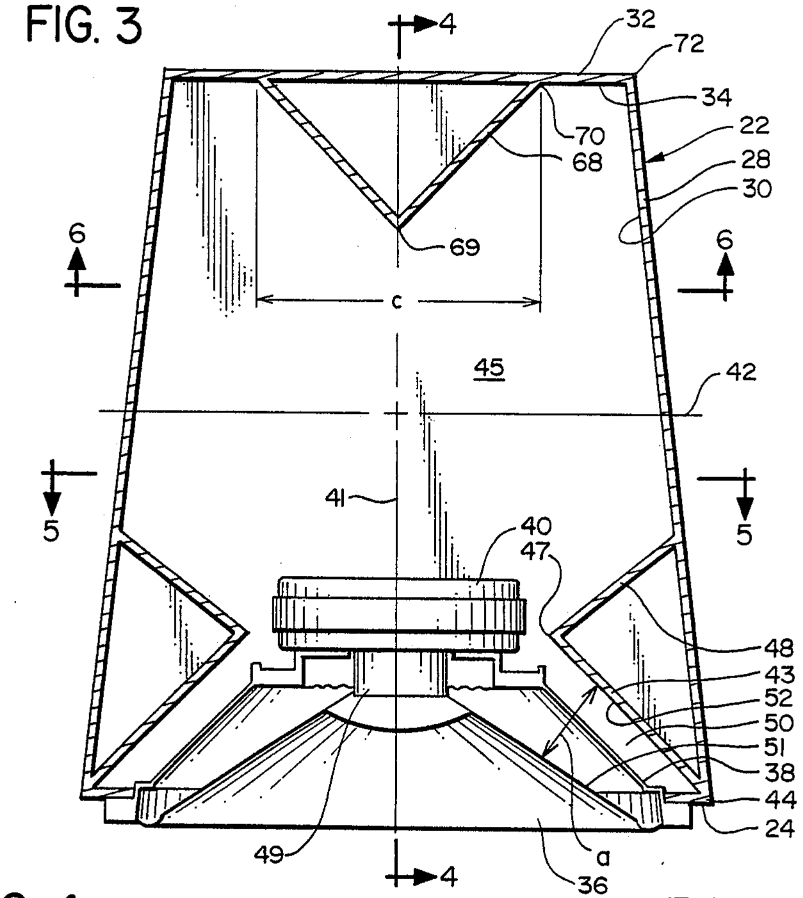
FIG. 3 is a top sectional view of a first embodiment of the speaker system taken along line 3—3 of FIG. 1.
Figure 4:
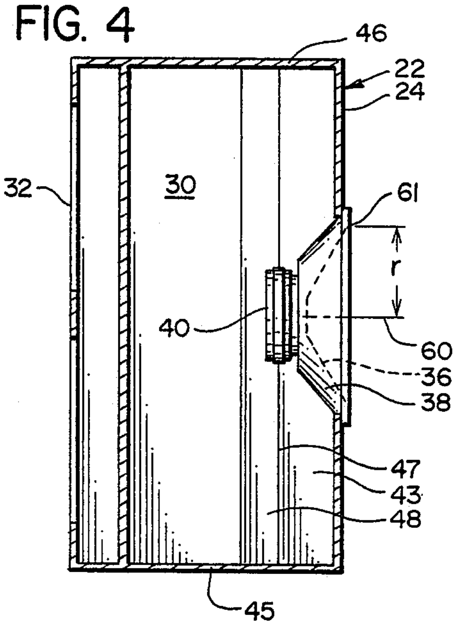
FIG. 4 is a side sectional view taken along line 4—4 of FIG. 3.

Each sidewall 28 converges in a rearward direction so that its imaginary extension forms an angle of at least ten degrees with the lengthwise axis 41. An upper limit to this angle is a function of the geometry of the enclosure, with a maximum angle being formed so that the sidewalls 28 intersect with corners 70 of the deflection panels 68. Preferably, however, sidewalls 28 converge so that a portion of the rear wall 32 remains between the corners 70 and the intersection of the rear wall 32 and sidewall 28, as shown in FIG. 3. More specifically, if the sidewalls 28 intersect with the deflection panel corners 70, an angle therebetween of less than 90 degrees is formed. It is believed that this tends to focus the waves inside the enclosure which causes their unwanted reinforcement. Therefore, it is preferable that interior angles within the enclosure be at least ninety degrees to minimize any focusing of the waves. An exception to this requirement occurs at the intersections of the isolation panels 43, with the sidewalls 28 and front wall 24. It is believed that there is a minimal focusing here due to the close proximity to the diaphram 36.

Figure 7:
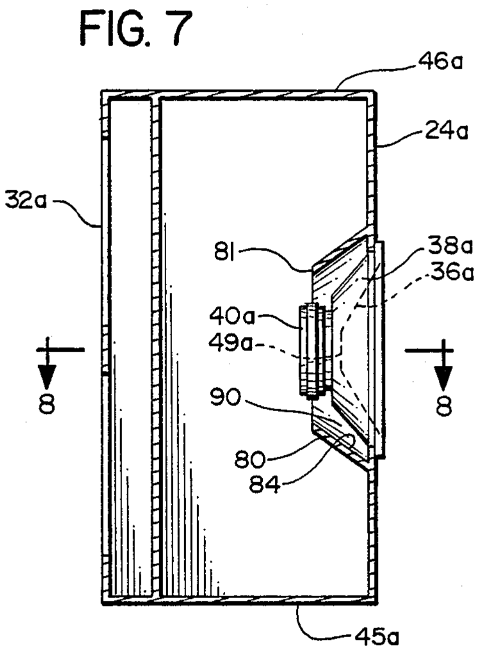
FIG. 7 is a side sectional view of a second embodiment of the speaker system.
Figure 9:
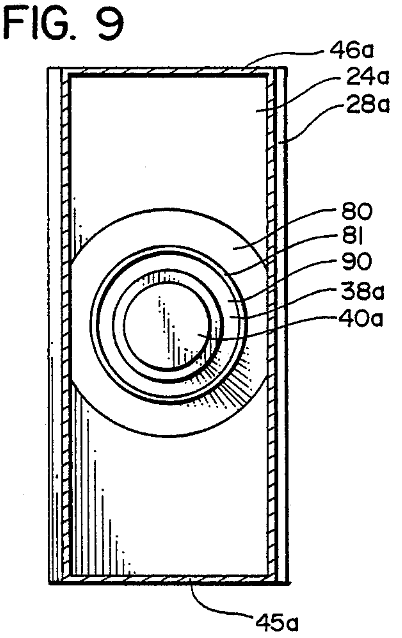
FIG. 9 is a transverse sectional view, looking forward, taken along line 9—9 of FIG. 8.
Figure 8:
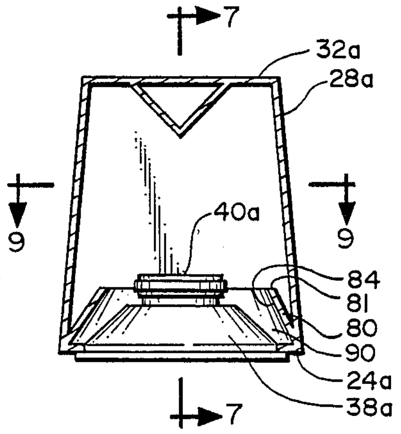
FIG. 8 is a sectional plan view of the second embodiment taken along line 8—8 of FIG. 7.

In another embodiment of the present invention shown in FIGS. 7 through 9, like elements described in the previous embodiment are designated by the numerals with a suffix "a" attached. In this embodiment, the isolation panels 43 are replaced by an isolation enclosure 80. More specifically, the isolation enclosure 80 has a conical configuration which converges in a rearward direction. The isolation enclosure is truncated at a rear edge 81 where there is located a rear outlet opening through which the magnet 40*a* extends. As discussed in the previous embodiment, the area of the rear outlet opening is greater than the effective piston area of the diaphram. The isolation enclosure 80 is mounted to the rear surface of the front wall 24*a* and extends circumferentially about the diaphram 36*a* and speaker frame 38*a*. The enclosure is formed so that when proceeding in a rearward direction inside the enclosure, sidewalls 84 of the enclosure diverge from the sides of the speaker diaphram. In the present embodiment, the conical sidewall 84 of the enclosure extends rearward and terminates at the edge 81 which is rearward of the rearward surface 49*a* of the diaphram. In this manner, an annular channel 90 is formed between the isolation enclosure sidewall and the sides of the speaker diaphram so as to suppress the generation of unwanted rearward waves. The transverse dimension of this channel, identified by the letter "b'" in FIG. 7, is sized in a manner discussed with reference to the first embodiment.

Figure 11:
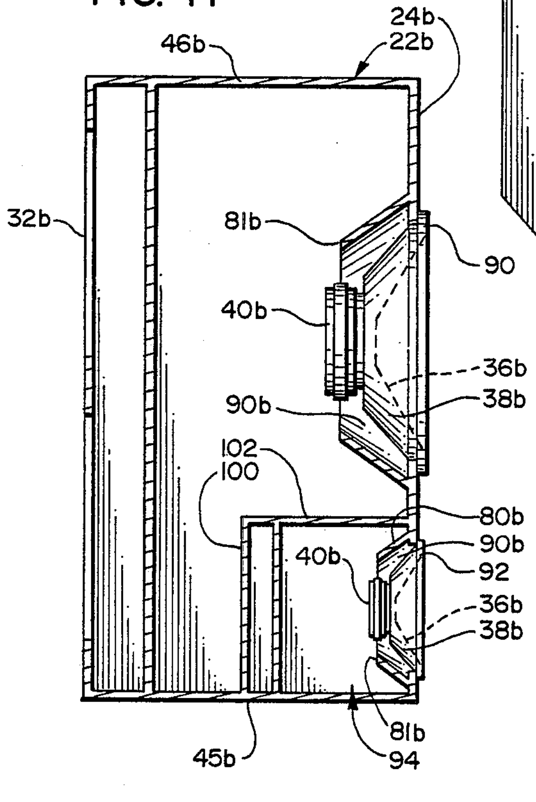
FIG. 11 is a side sectional view of a third embodiment of the speaker system which utilizes two or more speakers.

In the first two embodiments of the present invention, the configuration of the enclosure has been discussed with reference to only one speaker of a selected speaker size. In a third embodiment shown in FIG. 11, like elements designated in previous embodiments are designated by like numerals with the suffix "b" attached. In this embodiment, two or more speakers are provided in the enclosure to improve overall frequency response. For example, as shown in FIG. 11, it may be desirable to have a woofer 90 to generate frequencies up to about 1000 Hz, and a second mid range speaker 92 to generate higher frequencies. In this case, the midrange speaker 92 is installed within a separate isolation subenclosure indicated at 94, located inside the main enclosure 20*b*. The subenclosure 94 is formed in an identical manner to the main enclosure discussed with reference to FIGS. 7 through 9, except its dimensions are smaller than the main enclosure. The subenclosure 94 is formed by the front wall 24*b*, floor 45*b*, a rear vertical wall 100 and a ceiling 102. The associated isolation channel 90*b* has a smaller maximum transverse dimension than the isolation channel of the lower frequency woofer 90 so as to suppress a higher frequency range.

What is claimed is:

1. An enclosure, including a lengthwise axis and a transverse axis, for an audio speaker assembly having an audio generating diaphram with sides that converge in a rearward direction inside the enclosure, the enclosure comprising:

a. a housing, including a front wall, a rear wall, and first and second sidewalls which are connected between the front wall and the rear wall;

b. means for connecting the audio speaker assembly to a forward portion of the housing; and c. means for providing a channel of a selected width at a location rearward of the diaphram, the channel providing means including an isolation member which is connected to the housing and which extends in a rearward and inward direction within the enclosure and about the diaphram, the isolation member being positioned at a selected spaced apart location from the diaphram sides so as to suppress the generation of rearward directed audio waves of selected frequencies.

2. The enclosure as set forth in claim 1 wherein the suppression of the selected frequencies of audio waves is a function of the channel width.

3. The enclosure as set forth in claim 2 wherein:

a. the selected suppressed audio waves include a range of frequencies having a minimum frequency; and b. the channel is formed so that by decreasing the channel width, the minimum frequency of the suppressed audio waves is increased.

4. The enclosure as set forth in claim 3 wherein the channel is formed so that a maximum value of the channel width is equal to a quantity which represents the speed of sound through air at sea level divided by a quantity which represents twice the minimum frequency.

5. The enclosure as set forth in claim 1 wherein:

a. the speaker diaphram includes a forward edge and a rearward edge;

b. the isolation member terminates at a rearward surface which is located rearward of the diaphram rear edge so as to form the channel between the forward and rearward edges of the diaphram.

6. The enclosure as set forth in claim 5 wherein:

a. the rearward surface of the isolation member forms an outlet opening which is rearward of the diaphram; and b. the rear outlet opening is sized to have an area which is at least as great as an area of the diaphram of a radius r which is measured in a radial direction between an axial centerline of the diaphram and an outer circumferential edge of the diaphram.

7. The enclosure as set forth in claim 6 wherein:

a. the diaphram has a conical configuration; and b. the isolation member includes first and second isolation panels which extend rearward and inward from the front wall of the housing, and which terminate at respective first and second vertical edges at locations rearward of the rear surface of the diaphram.

8. The enclosure as set forth in claim 7 wherein the isolation panels are positioned so as to extend rearward and inward within the housing in a rearward diverging manner from the sidewalls of the diaphram.

9. The enclosure as set forth in claim 8 wherein:

a. the isolation member is formed in a triangular configuration by means of (1) the first isolation panel which extends in an inward and rearward direction from the first sidewall and which terminates in a first rear upstanding edge, (2) a first support panel which extends outward and rearward from the first rear edge and which terminates at the first sidewall; and b. the inner surfaces of the first isolation panel, the first support panel, and the first sidewall form an upstanding passageway for receiving means therethrough for suspending the housing above the ground.

10. The enclosure as set forth in claim 1 additionally comprising a deflection member which is attached to the rear wall, the deflection member including first and second deflection panels which extend forward and inward within the housing so as to reflect nonsuppressed rearward directed audio waveforms toward the sidewalls.

11. The enclosure as set forth in claim 10 wherein:

a. the deflection member has a transverse dimension which is at least as great as a transverse dimension of the rear outlet opening; and b. the deflection member is positioned directly rearward of the rear outlet opening.

12. The enclosure as set forth in claim 11 wherein:

a. the first and second deflection panels are connected to the rear wall at first and second connection points; and b. the first and second connection points, respectively, are located directly rearward of the first and second isolation panel upstanding edges, respectively.

13. The enclosure as set forth in claim 1 wherein:

a. the diaphram has a conical configuration;

b. the isolation member has a conical configuration and is mounted to the housing in a manner about the diaphram so that the channel formed between the diaphram sides and the isolation member has an annular configuration; and c. the isolation member includes a rear opening for passing audio waves therethrough to a rear portion of the housing.

14. The enclosure as set forth in claim 13 wherein the suppression of the selected frequencies of audio waves is a function of the channel width.

15. The enclosure as set forth in claim 14 wherein:

a. the selected suppressed frequencies include a range of frequencies having a minimum frequency; and b. the channel is formed so that by decreasing the channel width, the minimum frequency of the suppressed audio waves is increased.

16. The enclosure as set forth in claim 15 wherein the channel is formed so that a maximum value of the channel width is equal to a quantity which represents the speed of sound through air at sea level divided by a quantity which represents twice the minimum frequency.

17. The enclosure as set forth in claim 13 wherein:

a. the speaker diaphram includes a forward edge and a rearward edge;

b. the isolation member terminates at a rearward surface which is located rearward of the diaphram rear edge so as to form the channel between the forward and rearward edges of the diaphram.

18. The enclosure as set forth in claim 17 wherein:

a. the rearward surface of the isolation member forms an outlet opening which is rearward of the diaphram; and b. the rear outlet opening is sized to have an area which is at least as great as an area of the diaphram of a radius r which is measured in a radial direction between an axial centerline of the diaphram and an outer circumferential edge of the diaphrâm.

* * * * *